(12) United States Patent
Maziasz et al.

(10) Patent No.: US 7,721,245 B2
(45) Date of Patent: May 18, 2010

(54) SYSTEM AND METHOD FOR ELECTROMIGRATION TOLERANT CELL SYNTHESIS

(75) Inventors: Robert L. Maziasz, Austin, TX (US); Vladimir P. Rozenfeld, Andreevka (RU); Iouri Smirnov, Andreevka (RU); Sergei V. Somov, Moscow (RU); Igor G. Topouzov, Moscow (RU); Lyudmila Zinchenko, Moscow (RU)

(73) Assignee: Freescale Semiconductor, Inc., Austin, TX (US)

( * ) Notice: Subject to any disclaimer, the term of this patent is extended or adjusted under 35 U.S.C. 154(b) by 123 days.

(21) Appl. No.: 11/811,407

(22) Filed: Jun. 11, 2007

(65) Prior Publication Data

US 2008/0092100 A1     Apr. 17, 2008

(51) Int. Cl.
    *G06F 17/50*    (2006.01)
(52) U.S. Cl. .......................................... 716/13; 716/12
(58) Field of Classification Search .............. 716/12–14
    See application file for complete search history.

(56) References Cited

U.S. PATENT DOCUMENTS

| | | | |
|---|---|---|---|
| H842 H | 11/1990 | Ochs | |
| 5,737,580 A | 4/1998 | Hathaway et al. | |
| 5,831,867 A * | 11/1998 | Aji et al. ........................ | 716/4 |
| 6,308,302 B1 | 10/2001 | Hathaway et al. | |
| 6,493,859 B1 | 12/2002 | Gould et al. | |
| 6,823,500 B1 | 11/2004 | Ganesh et al. | |
| 6,877,148 B1 * | 4/2005 | Hassibi et al. ................ | 716/13 |
| 6,880,139 B2 | 4/2005 | Mau et al. | |
| 7,016,794 B2 * | 3/2006 | Schultz ........................ | 702/64 |
| 7,096,450 B2 * | 8/2006 | Gill et al. ...................... | 716/15 |
| 7,103,863 B2 * | 9/2006 | Riepe et al. .................... | 716/7 |
| 7,131,096 B1 * | 10/2006 | Balsdon et al. ............... | 716/13 |
| 2004/0178821 A1 | 9/2004 | Bal et al. | |
| 2005/0289494 A1 | 12/2005 | Kozhaya et al. | |

FOREIGN PATENT DOCUMENTS

| | | |
|---|---|---|
| EP | 0629853 A2 | 12/1994 |
| JP | 59061770 | 4/1984 |
| RU | 2222869 C2 | 1/2004 |

OTHER PUBLICATIONS

International Search Report and Written Opinion.

* cited by examiner

*Primary Examiner*—Jack Chiang
*Assistant Examiner*—Binh C Tat
(74) *Attorney, Agent, or Firm*—Van Leeuwen & Van Leeuwen

(57) ABSTRACT

A method, data processing system, and computer program product are provided for routing a circuit placement a number of times, resulting in a number of routings. An electromigration quality value is computed for each of the routings, and the routing with the best electromigration quality value is selected. In one embodiment, each routing is analyzed with attention to the current that passes through each of the routing's segments in order to compute a current distribution that is used to compute a routing quality vector. In another embodiment, multiple placements are generated and the electromigration placement quality vectors are computed for the various placements with the placement with the best electromigration quality vector being selected. In one embodiment, the placement with the best electromigration quality vector is routed the number of times to determine the routing with the lowest (best) electromigration quality value.

20 Claims, 6 Drawing Sheets

SYSTEM AND METHOD FOR ELECTROMIGRATION TOLERANT CELL SYNTHESIS

FIELD OF THE INVENTION

The present invention relates generally to a system and method for designing circuits with improved electromigration characteristics. More particularly, the present invention relates to a system and method for generating electromigration quality vectors to select circuit placements and routings.

RELATED ART

Electromigration is the transport of material caused by the gradual movement of the ions in a conductor due to the momentum transfer between conducting electrons and diffusing metal atoms. The effect is seen in applications where high direct current densities are used, such as in microelectronics and related structures. As the structure size in electronics such as integrated circuits (ICs) decreases, the practical significance of this effect increases. Research the field of electromigration was pioneered by James R. Black, who set the basis for all research in this area and for whom the Black equation is named.

Electromigration decreases the reliability of ICs. In the worst case it leads to the eventual loss of one or more connections and intermittent failure of the entire circuit. Since the reliability of interconnects is not only of great interest in the field of space travel and for military purposes but also with civilian applications like for example the anti-lock braking system of cars, high technological and economic values are attached to this effect.

Due to the relatively high life span of interconnects and the short product lifecycle of most consumer ICs, it is not practical to characterize a product's electromigation under real operating conditions. A mathematical equation, the Black equation, is commonly used to predict the life span of interconnects in integrated circuits tested under "stress", that is external heating and increased current density, and the model's results can be extrapolated to the device's expected life span under real conditions.

Although electromigration damage ultimately results in failure of the affected IC, the first symptoms are intermittent glitches, and are quite challenging to diagnose. As some interconnects fail before others, the circuit exhibits seemingly random errors, which may be indistinguishable from other failure mechanisms (such as electrostatic discharge (ESD) damage.) In a laboratory setting, electromigration failure is readily imaged with an electron microscope, as interconnect erosion leaves telltale visual markers on the metal layers of the IC.

With increasing miniaturization the probability of failure due to electromigration increases in Very Large Scale Integrated (VLSI) circuits because both the power density and the current density increase. In advanced semiconductor manufacturing processes, copper has replaced aluminum as the interconnect material of choice. Despite its greater fragility in the fabrication process, copper is preferred for its superior conductivity. It is also intrinsically less susceptible to electromigration. However, electromigration continues to be an everpresent challenge to device fabrication, and therefore the EM research for copper interconnects is ongoing.

During the circuit development process, many metrics are used to ascertain a circuit's expected performance and other characteristics. These metrics are also used to compare the expected characteristics of one circuit design to the expected characteristics of another circuit design. Yet traditional metrics fail to adequately ensure electromigration tolerant standard cell layouts. One approach to avoiding electromigration issues is to widen wire widths. However, this approach results in extra wiring space and larger circuit areas.

BRIEF DESCRIPTION OF THE DRAWINGS

The present invention may be better understood, and its numerous objects, features, and advantages made apparent to those skilled in the art by referencing the accompanying drawings, wherein.

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
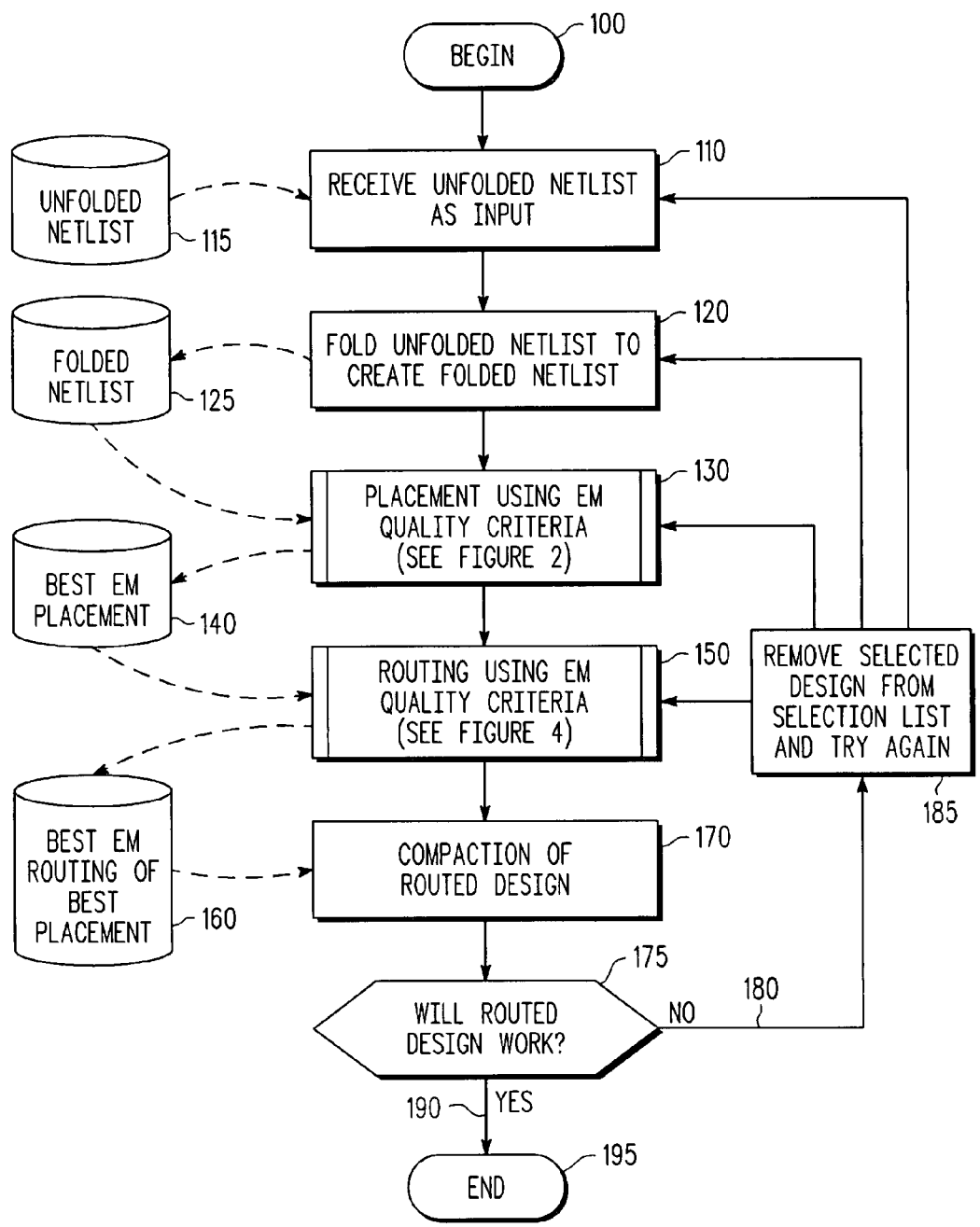
FIG. 1 is a high-level flowchart showing overall processing steps.

FIG. 1 is a high-level flowchart showing overall processing steps for designing a circuit with desired electromigration qualities. The result of the processing shown in FIG. 1 is a circuit design with desirable electromigration characteristics, both in terms of cell placement as well as routing of the placement.

Processing commences at 100, whereupon, at step 110, unfolded netlist 115 is received as input. Unfolded netlist is a circuit design representation of a desired circuit. The circuit design is created using standard circuit design software tools. At step 120, the unfolded netlist is folded, creating folded netlist 125. The folded netlist is used to generate a placement. Placement processing takes into account electromigration (EM) quality criteria in order to select a placement with a preferred electromigration tolerance (predefined process 130, see FIG. 2 and corresponding text for processing details). Placement processing results in best electromigration placement 140. This "best" electromigration placement is routed using predefined process 150 (see FIG. 4 and corresponding text for processing details). Again, during routing, the "best" electromigration routing is identified and stored as best routing of the best placement (160).

At step 170, the best electromigration routing of the best electromigration placement (160) is compacted. At this point, a process or the circuit designer determines whether the compacted design will work given the design constraints (decision 175). One example of a design constraint is a physical size constraint. Other examples of design constraints are known by those skilled in the art. If the routed design will not work given the design constraints, then decision 175 branches to "no" branch 180 whereupon, at step 185, the selected design is removed from the list of possible design selections and processing loops back to re-place the design and re-route the re-placed design (with the re-placing and re-routing each using electromigration quality criteria). The action that is performed depends on the step in the process that is being addressed. As shown, step 185 loop back to any of steps 110, 120, 130, or 150 depending on the action that is being taken. This looping continues until a compacted design is created that works given the design constraints, at which point decision 175 branches to "yes" branch 190 and processing ends at 195.

Figure 2:
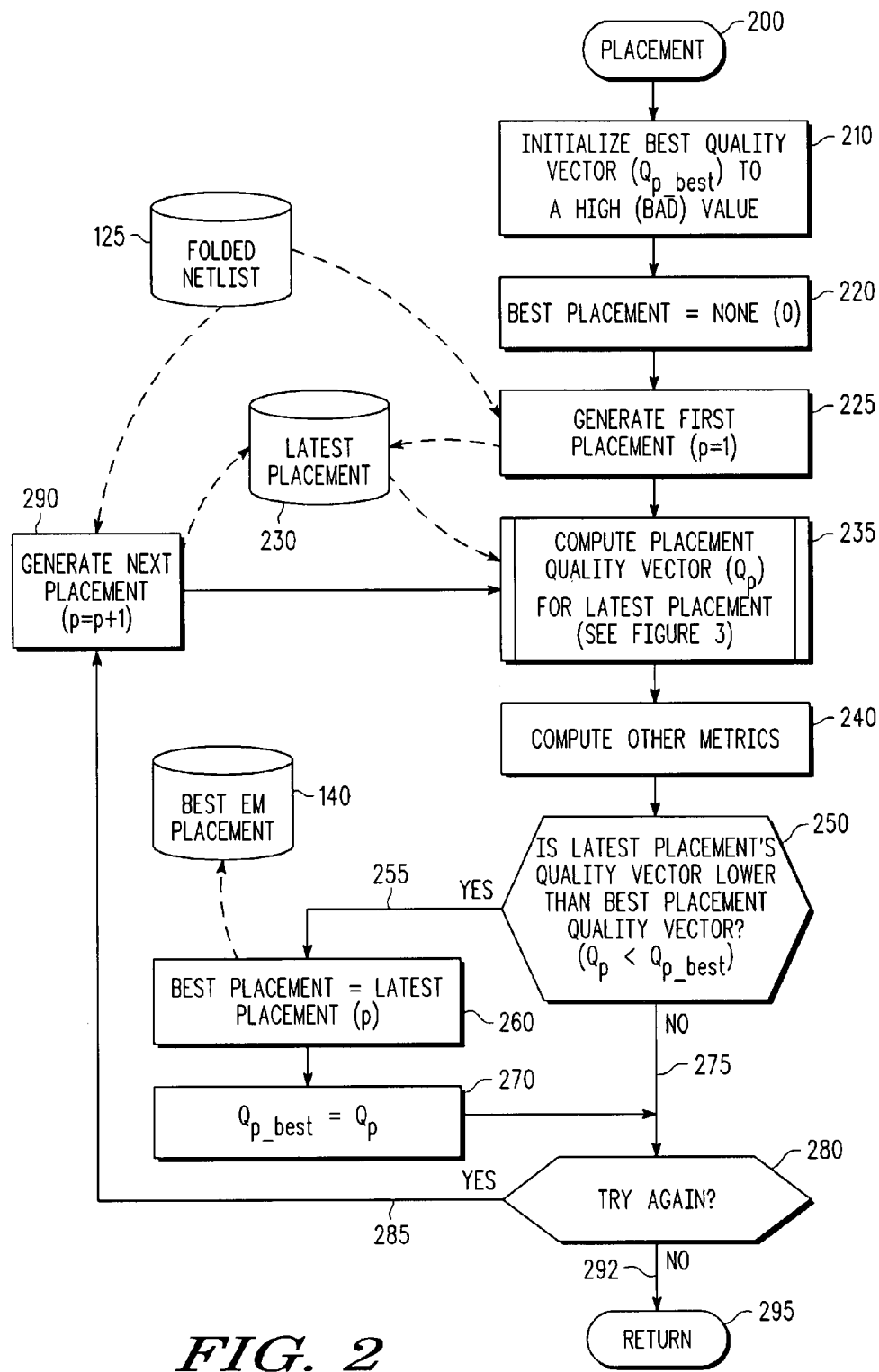
FIG. 2 is a flowchart showing the steps to select a placement with desired electromigration qualities.

FIG. 2 is a flowchart showing the steps to select a placement with desired electromigration qualities. Processing commences at 200 whereupon, at step 210, an electromigration placement "best quality" vector ($Q_{p\_best}$) is initialized to a high (bad) value. An example of an initial, bad, value to use for the placement best quality vector would be (99, 99) with the first 99 vector value representing a high current value and the second 99 vector value representing 99 occurrences of the high current value. At step 220, the best placement identifier is initialized to zero (indicating that no "best placement" has yet been identified). At step 225, the first placement is generated (p=1), using folded netlist 125 as the input design. The electromigration placement quality vector ($Q_p$) is computed for the first generated placement (predefined process 235, see FIG. 3 and corresponding text for details regarding how the electromigration placement quality vector is computed). The electromigration placement quality vector is one embodiment of an electromigration placement quality value. At step 240, other metrics that may be used to evaluate the placement are computed. The other metrics that are computed may vary based upon the design goals and are generally known to those skilled in the art. In one embodiment, the other metrics are used as a tiebreaker in selecting between placements that have the same electromigration placement quality vectors. In an alternative embodiment, the electromigration placement quality vector and the other quality metrics are given weighted values. In this alternative embodiment, these weighed values are used to determine an overall score and, ultimately, which placement has the best placement quality vector.

At decision 250, a determination is made as to whether the latest placement's electromigration quality vector ($Q_p$) is lower than (i.e., better than) the "best" electromigration placement quality vector ($Q_{p\_best}$). Because the best electromigration placement quality vector was initialized to a high (bad) value, the first placement will have a lower (better) electromigration placement quality vector than the initialized "best" electromigration placement quality vector so that decision 250 branches to "yes" branch 255 whereupon, at step 260, the best placement (140) is set to equal the first placement (p=1) value, and, step 270, the latest best electromigration placement quality vector ($Q_{p\_best}$) is replaced with the electromigration placement quality vector ($Q_p$) computed for the first placement. During successive iterations, if another placement's electromigration placement quality vector is better than the "best" electromigration placement quality vector, then decision 250 will again branch to "yes" branch 255 and perform steps 260 and 270. However, if a electromigration quality placement vector for a subsequent placement ($Q_p$) is not less (better) than the "best" electromigration placement quality vector, then decision 250 will branch to "no" branch 275 bypassing steps 260 and 270.

A determination is made as to whether another placement should be generated and its electromigration placement quality vector compared with the best quality vector (decision 280). The decision as to how many placements should be generated and evaluated can be based upon several factors such as termination conditions of particular optimization algorithms, certain metric factors, a time/effort factor of wanting to generate a certain number of placements, or a subjective factor where an experienced circuit designer decides when to stop generating additional placements based on the designer's knowledge and experience in designing circuits. If additional placement(s) are desired, decision 280 branches to "yes" branch 285 whereupon, at step 290, the next placement (p=p+1) is generated from folded netlist 125 to create latest placement 230 and processing loops back to compute the placement quality vector ($Q_p$) for the newly generated placement and compare this placement's quality vector with the latest best placement's quality vector. This looping continues until additional placements are no longer desired, at which point decision 280 branches to "no" branch 292 and processing returns at 295.

Figure 3:
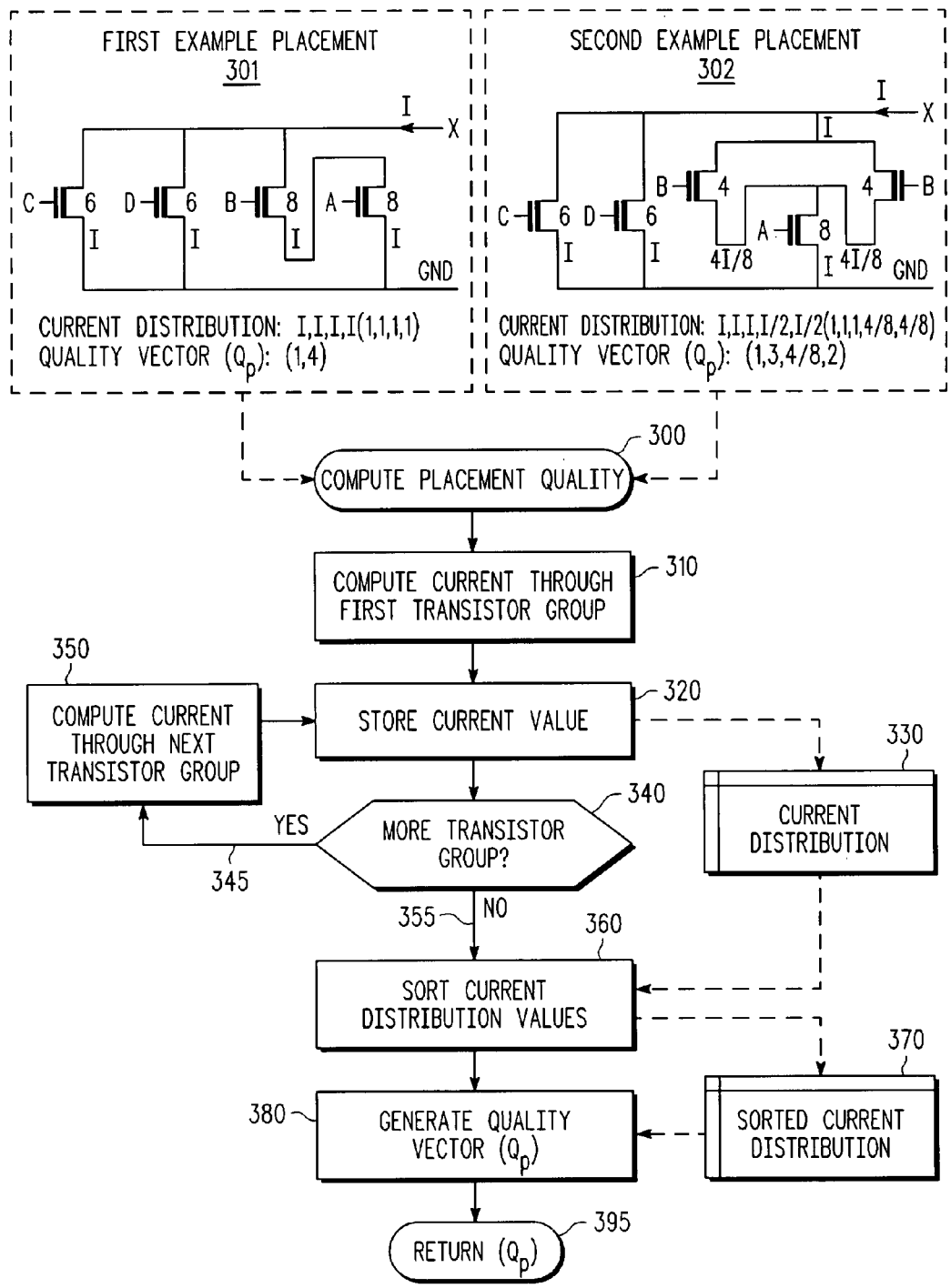
FIG. 3 is a flowchart showing the steps taken to compute a placement quality vector for a given placement.

FIG. 3 is a flowchart showing the steps taken to compute an electromigration placement quality vector for a given placement. FIG. 3 depicts two example placements—first example placement 301 and second example placement 302. The example placement are used to illustrate how current distributions and placement quality vectors are computed. The process that computes the placement quality vectors is shown commencing at 300, whereupon, at step 310, the relative current that passes through the first transistor group of a placement is computed. In the first example placement, full current (I) passes though each of the transistor groups, while in the second example placement, full current passes through three of the transistor groups and half-current passes through two of the transistor groups.

At step 320, the current that passes through the first transistor group is stored in current distribution memory area 330. A determination is made as to whether there are more transistor groups to process (decision 340). The first example placement depicts a placement with four transistor groups, thus decision 340 will be true (yes) three times when processing the first example placement. The second example placement depicts a placement with five transistor groups, thus decision 340 will be true (yes) four times when processing the second example placement. If there are more transistor groups, decision 340 branches to "yes" branch 345 whereupon, at step 350, the current that passes through the next transistor group is computed and processing loops back to store the current that passes through the transistor group in current distribution memory area 330. This looping continues until all transistor groups have been processed, at which point decision 340 branches to "no" branch 355.

After the current that passes through all of the transistor groups has been computed, at step 360, the current distribution values are sorted from high to low values. For example, in the second example placement there are five transistor groups—three transistor groups have full current (I) passing through them and two transistor groups have half current (I/2) passing through them. The result of sorting the current distribution in this example is shown as being (I, I, I, I/2, I/2). The results of the sorting are stored an sorted current distribution memory area 370. At step 380, the sorted current distribution is used to generate the electromigration placement quality vector ($Q_p$) for the placement, and processing returns at 395.

The electromigration placement quality vector is computed by counting the number of equal current values. So, for the first example placement where full current (I) passes through each of the transistor groups, the electromigration placement quality vector ($Q_p$) is (1, 4) with "1" representing full current and "4" representing the number of transistor groups found to have full current passing through them. Likewise, for the second example placement where full current (I) passes through three of the transistor groups and half current (I/2) passes through two of the transistor groups, the electromigration placement quality vector ($Q_p$) is (1, 3, 4/8, 2) where "1" again representing full current, "3" representing the number of transistor groups found to have full current passing through them, "4/8" (which can be reduced to ½ or 0.5) representing half current (I/2), and "2" representing the number of transistor groups where I/2 current passes through the group. If the quality vectors ($Q_p$) for the first and second example placements are compared (e.g., using a decision such as that shown in decision 250 in FIG. 2), the second example placement has a lower electromigration placement quality vector. Each of the electromigration placement quality vectors have a "1" for the first vector value, but the second example placement has a "3" for the second vector value, while the first example placement has a "4" for the second vector value. Since "3" is less than "4", the second example placement would be considered "better" than the first example placement in terms of the respective electromigration placement quality vectors.

Figure 4:
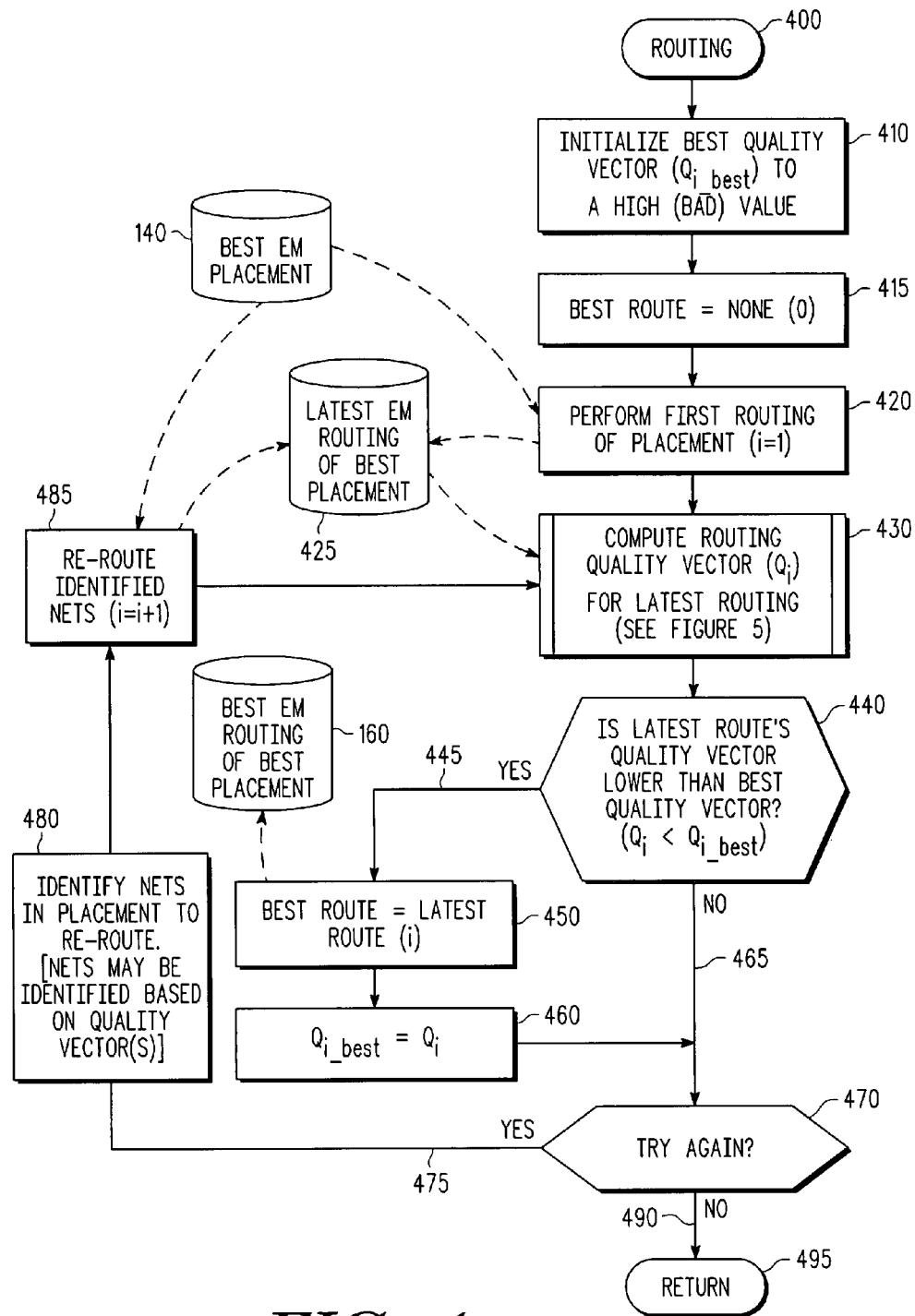
FIG. 4 is a flowchart showing the steps taken to select a routing of a selected placement with desired electromigration qualities.

FIG. 4 is a flowchart showing the steps taken to select a routing of a selected placement with desired electromigration qualities. In one embodiment, a "best" electromigration placement is found using the steps shown in FIGS. 2 and 3 and then a preferred routing, in terms of electromigration, is found for the best placement. However, the techniques shown in FIGS. 4 and 5 for identifying a routing for a given placement can be used for virtually any placement regardless of whether the techniques shown in FIGS. 2 and 3 were used to generate and identify the placement.

Routing processing commences at 400 whereupon, at step 410, the best electromigration routing quality vector ($Q_{i\_best}$) is initialized to a high (bad) value. An example of an initial, bad, value to use for the best electromigration routing quality vector would be (99, 99) with the first 99 vector value representing a high current value and the second 99 vector value representing 99 occurrences of the high current value. At step 415, the best route for the placement is initialized to zero (0) indicating that a best routing has not yet been identified. At step 420, the placement (140) is routed a first time (i=1), resulting in latest routing 425. In one embodiment, the route is computed using a routing engine.

Figure 5:
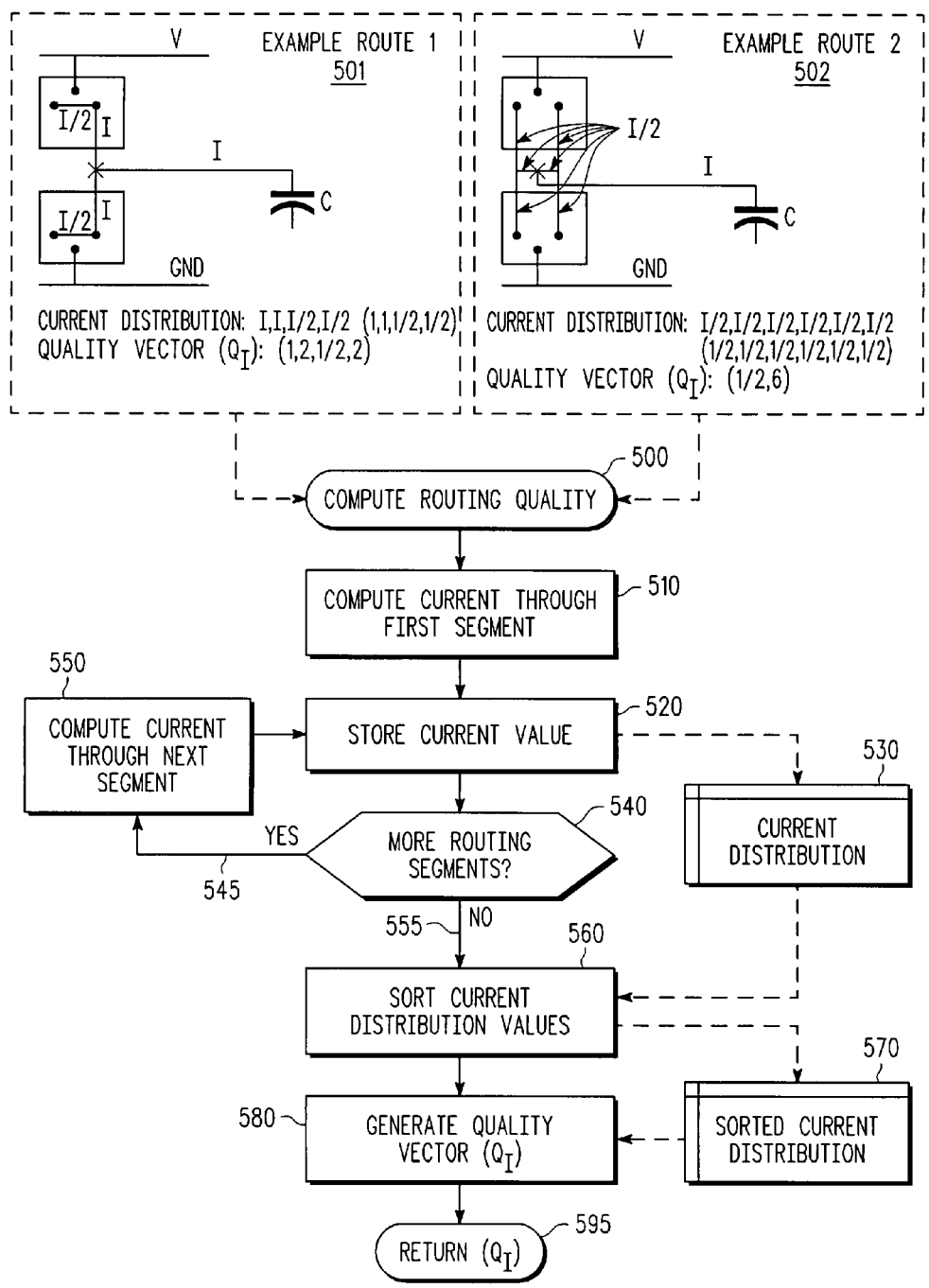
FIG. 5 is a flowchart showing the steps taken to compute a routing quality vector for a given routing of the selected placement.

The electromigration routing quality vector ($Q_i$) is computed for the latest routing (predefined process 430, see FIG. 5 and corresponding text for processing details). The electromigration routing quality vector is one embodiment of an electromigration routing quality value. The latest electromigration routing quality vector ($Q_i$) is compared to the best electromigration routing quality vector ($Q_{i\_best}$). In decision 440, a determination is made as to whether the latest electromigration routing quality vector ($Q_i$) is lower (better) than the best electromigration routing quality vector ($Q_{i\_best}$). The first electromigration routing quality vector will be lower (better) than the initial best electromigration routing quality vector since the initial best electromigration routing quality vector was set to a high value. In this case, decision 440 will branch to "yes" branch 445 whereupon, at step 450, the best route (160) is set to be the first routing, and, at step 460, the best electromigration routing quality vector ($Q_{i\_best}$) is set to be the latest electromigration routing quality vector ($Q_i$). During subsequent iterations, if another routing is found with an electromigration routing quality vector ($Q_i$) that is better than the best routing quality vector ($Q_{i\_best}$), then decision 440 branches to "yes" branch 445 and steps 450 and 460 are performed. On the other hand, if a subsequent routing is found with an electromigration routing quality vector ($Q_i$) that is not better than the best routing quality vector ($Q_{i\_best}$), then decision 440 branches to "no" branch 465 bypassing steps 450 and 460.

A determination is made as to whether another routing should be generated and its electromigration routing quality vector compared with the best electromigration routing quality vector (decision 470). The decision as to how many routings should be generated and evaluated can be based upon several factors such as termination conditions of particular optimization algorithms, certain metric factors, a time/effort factor of generating a certain number of routings, or a subjective factor where an experienced circuit designer decides when to stop generating additional routings based on the designer's knowledge and experience in designing circuits. If additional placement(s) are desired, decision 470 branches to "yes" branch 475 whereupon, at step 480, nets in the latest routed placement (425) are identified for re-routing (these nets may be identified based on the quality vectors that are computed in FIG. 5). At step 485, the identified nets are re-routed, forming a new latest electromigration routing of the placement (425), and the routing number is incremented (i=i+1). Processing then loops back to compute the electromigration routing quality vector for the latest routing. In one embodiment, rather than identifying specific nets in the placement to re-route, the entire placement is re-routed. This routing may perform the re-routing based on previously computed electromigration routing quality vectors. When no more routings (re-routings) are needed, decision 470 branches to "no" branch 490 and processing returns at 495.

FIG. 5 is a flowchart showing the steps taken to compute an electromigration routing quality vector for a given routing. FIG. 5 depicts two example routings—first example routing 501 and second example routing 502. The example routings are used to illustrate how current distributions and electromigration routing quality vectors are computed. The process that computes the electromigration routing quality vectors is shown commencing at 500, whereupon, at step 510, the current that passes through the first segment of the routing is computed. In the first example routing, full current (I) passes though two of the segments, and half-current (I/2) passes through the other two segments. In the second example routing, half current passes through all six segments.

At step 520, the current that passes through the first segment is stored in current distribution memory area 530. A determination is made as to whether there are more routing segments to process (decision 540). The first example routing depicts a routing with four segments, thus decision 540 will be true (yes) three times when processing the first example routing. The second example routing depicts a routing with six segments, thus decision 540 will be true (yes) five times when processing the second example routing. If there are more segments, decision 540 branches to "yes" branch 545 whereupon, at step 550, the current that passes through the next segment is computed and processing loops back to store the current that passes through the segment in current distribution memory area 530. This looping continues until all segments have been processed, at which point decision 540 branches to "no" branch 555.

After all of the segments have been processed, at step 560, the current distribution values are sorted from high to low values. For example, in the first example routing there are four segments—two segments have full current (I) passing through them and two transistor groups have half current (I/2) passing through them. The result of sorting the current distribution in the first example is shown as being (I, I, I/2, I/2). The results of the sorting are stored an sorted current distribution memory area 570. At step 580, the sorted current distribution is used to generate the electromigration routing quality vector ($Q_i$) for the routing, and processing returns at 595.

The electromigration routing quality vector is computed by counting the number of equal current values. So, for the first example routing where full current (I) passes through two of the segments and half-current passes through two of the segments, the electromigration routing quality vector ($Q_i$) is (1, 2, ½, 2) with "1" representing full current, the first "2" representing the number of segments found to have full current passing through them, "½" representing half current, and the second "2" representing the number of segments found to have half current passing through them. Likewise, for the second example routing where half current (I/2) passes through all six of the segments, the electromigration routing quality vector ($Q_i$) is (½, 6) where "½" again representing half current, and "6" representing the six segments found to have half current passing through them. If the electromigration routing quality vectors ($Q_i$) for the first and second example routings are compared (e.g., using a decision such as that shown in decision 440 in FIG. 4), the second example routing has a lower electromigration routing quality vector. The first value ("½") of the electromigration routing quality vector for the second example routing is lower than the first value ("1") of the routing quality vector for the first example routing. Since "½" is less than "1", the second example routing would be considered "better" than the first example routing in terms of the respective electromigration routing quality vectors.

Figure 6:
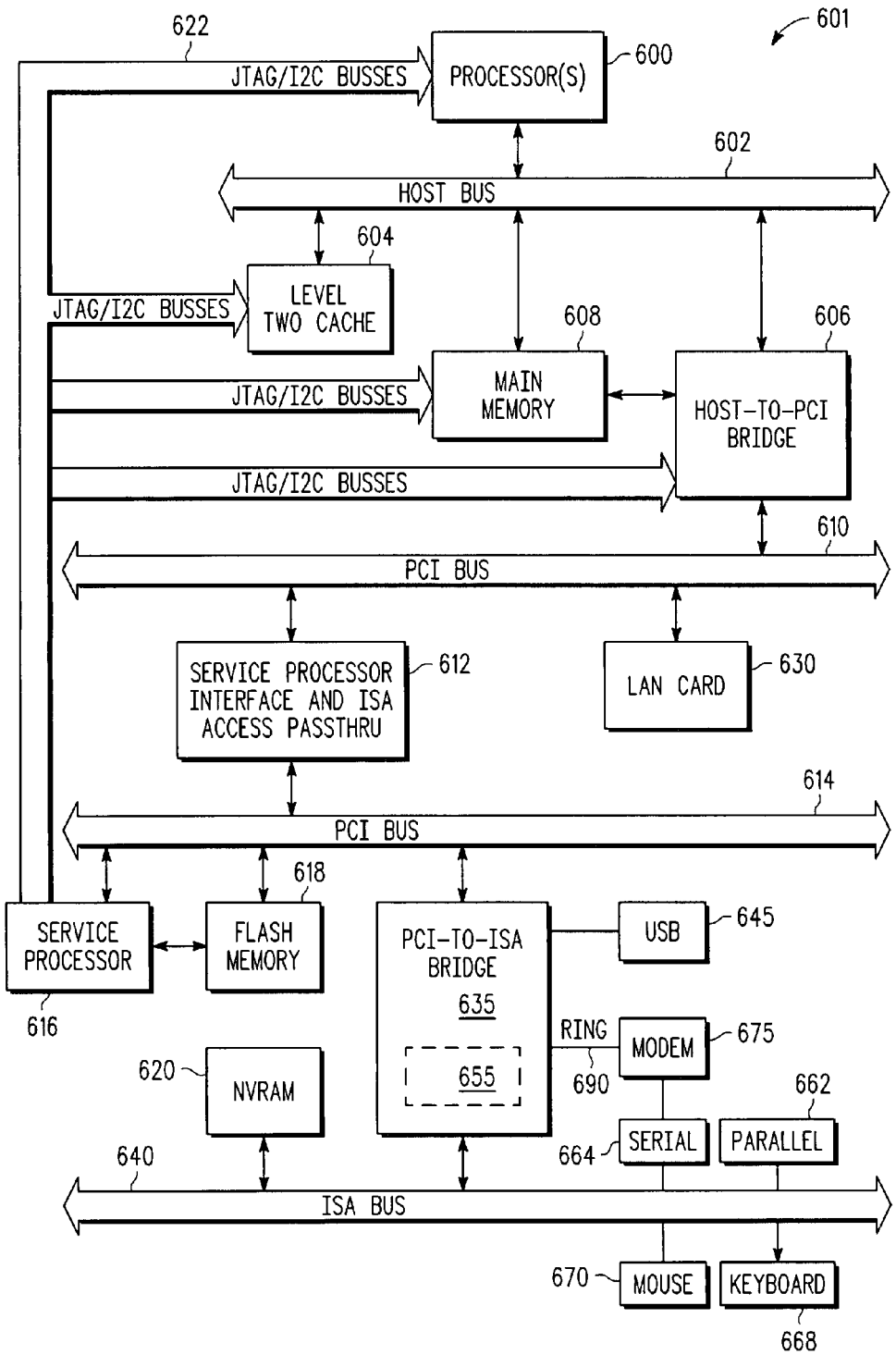
FIG. 6 is a block diagram of a data processing system in which the methods described herein can be implemented.

FIG. 6 illustrates information handling system 601 which is a simplified example of a computer system capable of performing the computing operations described herein. Computer system 601 includes processor 600 which is coupled to host bus 602. A level two (L2) cache memory 604 is also coupled to host bus 602. Host-to-PCI bridge 606 is coupled to main memory 608, includes cache memory and main memory control functions, and provides bus control to handle transfers among PCI bus 610, processor 600, L2 cache 604, main memory 608, and host bus 602. Main memory 608 is coupled to Host-to-PCI bridge 606 as well as host bus 602. Devices used solely by host processor(s) 600, such as LAN card 630, are coupled to PCI bus 610. Service Processor Interface and ISA Access Pass-through 612 provides an interface between PCI bus 610 and PCI bus 614. In this manner, PCI bus 614 is insulated from PCI bus 610. Devices, such as flash memory 618, are coupled to PCI bus 614. In one implementation, flash memory 618 includes BIOS code that incorporates the necessary processor executable code for a variety of low-level system functions and system boot functions.

PCI bus 614 provides an interface for a variety of devices that are shared by host processor(s) 600 and Service Processor 616 including, for example, flash memory 618. PCI-to-ISA bridge 635 provides bus control to handle transfers between PCI bus 614 and ISA bus 640, universal serial bus (USB) functionality 645, power management functionality 655, and can include other functional elements not shown, such as a real-time clock (RTC), DMA control, interrupt support, and system management bus support. Nonvolatile RAM 620 is attached to ISA Bus 640. Service Processor 616 includes JTAG and I2C busses 622 for communication with processor(s) 600 during initialization steps. JTAG/I2C busses 622 are also coupled to L2 cache 604, Host-to-PCI bridge 606, and main memory 608 providing a communications path between the processor, the Service Processor, the L2 cache, the Host-to-PCI bridge, and the main memory. Service Processor 616 also has access to system power resources for powering down information handling device 601.

Peripheral devices and input/output (I/O) devices can be attached to various interfaces (e.g., parallel interface 662, serial interface 664, keyboard interface 668, and mouse interface 670 coupled to ISA bus 640. Alternatively, many I/O devices can be accommodated by a super I/O controller (not shown) attached to ISA bus 640.

In order to attach computer system 601 to another computer system to copy files over a network, LAN card 630 is coupled to PCI bus 610. Similarly, to connect computer system 601 to an ISP to connect to the Internet using a telephone line connection, modem 675 is connected to serial port 664 and PCI-to-ISA Bridge 635.

While the computer system described in FIG. 6 is capable of executing the processes described herein, this computer system is simply one example of a computer system. Those skilled in the art will appreciate that many other computer system designs are capable of performing the processes described herein.

One of the implementations of the invention is a client application, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or on a nonvolatile storage device accessible through the Internet or other computer network where the set of instructions may be downloaded from the network-accessible nonvolatile storage device. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information that imparts functionality to a machine. Functional descriptive material includes, but is not limited to, computer programs, instructions, rules, facts, definitions of computable functions, objects, and data structures.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an;" the same holds true for the use in the claims of definite articles.

What is claimed is:

1. A computer-implemented method comprising:
routing a circuit placement a plurality of times, the routing resulting in a plurality of routings;
computing, by a processor, an electromigration routing quality value for each of the plurality of routings, wherein one or more of the electromigration quality values is based upon a computed current;
selecting one of the plurality of routings based on the selected routing's electromigration routing quality value; and generating the circuit placement using the selected routings.

2. The method of claim 1 wherein the computing further comprises:
identifying one or more segments in each of the plurality of routings;
computing a current through each of the identified segments, the computing of the current resulting in a current distribution corresponding to each of the routings; and
wherein the computing includes generating a plurality of electromigration routing quality vectors, wherein each of the electromigration routing quality vectors corresponds to one of the routings and to one of the current distributions, and wherein the electromigration routing quality value is the electromigration routing quality vector.

3. The method of claim 2 further comprising:
sorting the current distributions from a high current value to a low current value, wherein, generating each of the electromigration routing quality vectors includes:
grouping the sorted current distribution corresponding to the electromigration routing quality vector by storing unique current values and a count of the number of times that each unique current value appears in the sorted current distribution.

4. The method of claim 1 further comprising:
routing the circuit placement the first of the plurality of times;
computing the electromigration routing quality value of the first routing;
analyzing the first routing's electromigration routing quality value;
identifying one or more nets in the first routing based on the analysis;
re-routing the identified nets, the re-routing resulting in a second of the plurality of routings;
computing the electromigration routing quality value of the second routing;
comparing the first routing's electromigration routing quality value to the second routing's electromigration routing quality value;
selecting the first routing in response to the first routing's electromigration routing quality value being better than the second routing's electromigration routing quality value; and
selecting the second routing in response to the second routing's electromigration routing quality value being better than the first routing's electromigration routing quality value.

5. The method of claim 1 further comprising:
constructing the circuit placement prior to the routing, the constructing including:
creating a plurality of circuit placements corresponding to a circuit design;
computing an electromigration placement quality value for each of the plurality of circuit placements;
calculating one or more quality metrics corresponding to each of the plurality of circuit placements, wherein one of the metrics is the computed electromigration placement quality value; and
selecting the circuit placement from the plurality of circuit placements based on the quality metrics.

6. The method of claim 5 wherein the computing of the electromigration placement quality value further comprises:
identifying one or more transistor groups in each of the plurality of circuit placements;
computing a current through each of the identified transistor groups, the computing of the current resulting in one or more current distributions; and
generating an electromigration placement quality vector corresponding to the one or more current distributions, wherein the electromigration placement quality value is the electromigration placement quality vector.

7. The method of claim 6 further comprising:
sorting the current distributions from a high current value to a low current value, wherein the generation of the electromigration placement quality vector includes grouping the sorted current distributions by unique current values and a count of the number of times that each unique current value appears in the circuit placement.

8. The method of claim 6 further comprising:
prior to constructing the circuit placement:
receiving an unfolded netlist corresponding to a circuit design; and
folding the unfolded netlist, the folding resulting in a folded netlist, wherein the generating of the circuit placement is based on the folded netlist.

9. The method of claim 6 further comprising:
analyzing the selected routing;
determining, based on the analysis, whether the selected routing is a workable design;
in response to determining that the selected routing is an unworkable design:
re-constructing the circuit placement; and
performing the routing, the computing of the electromigration routing quality value, and the selecting of one of the routings using the re-generated circuit placement.

10. A data processing system comprising:
one or more processors;
a memory accessible by the processors;
a set of instructions stored in the memory, wherein one or more of the processors executes the set of instructions in order to perform actions of:
routing a circuit placement a plurality of times, the routing resulting in a plurality of routings;
computing an electromigration routing quality value for each of the plurality of routings, wherein one or more of the electromigration quality values is based upon a computed current;
selecting one of the plurality of routings based on the selected routing's electromigration routing quality value; and generating the circuit placement using the selected routings.

11. The data processing system of claim 10 wherein the computing further comprises instructions that perform the actions of:
identifying one or more segments in each of the plurality of routings;
computing a current through each of the identified segments, the computing of the current resulting in a current distribution corresponding to each of the routings; and wherein the computing includes generating a plurality of electromigration routing quality vectors, wherein each of the electromigration routing quality vectors corresponds to one of the routings and to one of the current distributions, and wherein the electromigration routing quality value is the electromigration routing quality vector.

12. The data processing system of claim 10 further comprising instructions that perform the actions of:
routing the circuit placement the first of the plurality of times;
computing the electromigration routing quality value of the first routing;
analyzing the first routing's electromigration routing quality value;
identifying one or more nets in the first routing based on the analysis;
re-routing the identified nets, the re-routing resulting in a second of the plurality of routings;
computing the electromigration routing quality value of the second routing;
comparing the first routing's electromigration routing quality value to the second routing's electromigration routing quality value;
selecting the first routing in response to the first routing's electromigration routing quality value being better than the second routing's electromigration routing quality value; and
selecting the second routing in response to the second routing's electromigration routing quality value being better than the first routing's electromigration routing quality value.

13. The data processing system of claim 10 further comprising instructions that perform the actions of:
constructing the circuit placement prior to the routing, the constructing including:
creating a plurality of circuit placements corresponding to a circuit design;
computing an electromigration placement quality value for each of the plurality of circuit placements;
calculating one or more quality metrics corresponding to each of the plurality of circuit placements, wherein one of the metrics is the computed electromigration placement quality value; and
selecting the circuit placement from the plurality of circuit placements based on the quality metrics.

14. The data processing system of claim 13 wherein the computing of the electromigration placement quality value further comprises instructions that perform the actions of:
identifying one or more transistor groups in each of the plurality of circuit placements;
computing a current through each of the identified transistor groups, the computing of the current resulting in one or more current distributions; and
generating an electromigration placement quality vector corresponding to the one or more current distributions, wherein the electromigration placement quality value is the electromigration placement quality vector.

15. A computer program product stored in a computer readable medium, comprising functional descriptive material that, when executed by a data processing system, causes the data processing system to perform actions that include:
routing a circuit placement a plurality of times, the routing resulting in a plurality of routings;
computing an electromigration routing quality value for each of the plurality of routings, wherein one or more of the electromigration quality values is based upon a computed current;
selecting one of the plurality of routings based on the selected routing's electromigration routing quality value; and generating the circuit placement using the selected routings.

16. The computer program product of claim 15 wherein the computing further comprises functional descriptive material that, when executed by a data processing system, causes the data processing system to perform actions that include:
identifying one or more segments in each of the plurality of routings;
computing a current through each of the identified segments, the computing of the current resulting in a current distribution corresponding to each of the routings; and
wherein the computing includes generating a plurality of electromigration routing quality vectors, wherein each of the electromigration routing quality vectors corresponds to one of the routings and to one of the current distributions, and wherein the electromigration routing quality value is the electromigration routing quality vector.

17. The computer program product of claim 16 further comprising comprises functional descriptive material that, when executed by a data processing system, causes the data processing system to perform actions that include:
sorting the current distributions from a high current value to a low current value, wherein, generating each of the electromigration routing quality vectors includes:
grouping the sorted current distribution corresponding to the electromigration routing quality vector by storing unique current values and a count of the number of times that each unique current value appears in the sorted current distribution.

18. The computer program product of claim 15 further comprising functional descriptive material that, when executed by a data processing system, causes the data processing system to perform actions that include:
constructing the circuit placement prior to the routing, the constructing including:
creating a plurality of circuit placements corresponding to a circuit design;
computing an electromigration placement quality value for each of the plurality of circuit placements;
calculating one or more quality metrics corresponding to each of the plurality of circuit placements, wherein one of the metrics is the computed electromigration placement quality value; and
selecting the circuit placement from the plurality of circuit placements based on the quality metrics.

19. The computer program product of of claim 15 wherein the computing of the electromigration placement quality value further comprises functional descriptive material that, when executed by a data processing system, causes the data processing system to perform actions that include::
identifying one or more transistor groups in each of the plurality of circuit placements;
computing a current through each of the identified transistor groups, the computing of the current resulting in one or more current distributions; and
generating an electromigration placement quality vector corresponding to the one or more current distributions, wherein the electromigration placement quality value is the electromigration placement quality vector.

20. The computer program product of claim 19 further comprising functional descriptive material that, when executed by a data processing system, causes the data processing system to perform actions that include:

sorting the current distributions from a high current value to a low current value, wherein the generation of the electromigration placement quality vector includes grouping the sorted current distributions by unique current values and a count of the number of times that each unique current value appears in the circuit placement.

* * * * *